(12) United States Patent
Yonemochi

(10) Patent No.: US 9,502,428 B1
(45) Date of Patent: Nov. 22, 2016

(54) SIDEWALL ASSISTED PROCESS FOR WIDE AND NARROW LINE FORMATION

(71) Applicant: SanDisk Technologies, Inc., Plano, TX (US)

(72) Inventor: Yasuaki Yonemochi, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/699,506

(22) Filed: Apr. 29, 2015

(51) Int. Cl.
*H01L 27/115* (2006.01)
*H01L 21/768* (2006.01)

(52) U.S. Cl.
CPC ... *H01L 27/11529* (2013.01); *H01L 21/76816* (2013.01); *H01L 21/76877* (2013.01)

(58) Field of Classification Search
CPC ............... H01L 27/11529; H01L 21/76816; H01L 21/76877
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 5,887,145 A | 3/1999 | Harari et al. | |
| 6,011,725 A | 1/2000 | Eitan | |
| 6,046,935 A | 4/2000 | Takeuchi et al. | |
| 6,429,123 B1 | 8/2002 | Tseng | |
| 6,894,341 B2 | 5/2005 | Sugimae et al. | |
| 7,291,560 B2 | 11/2007 | Parascandola et al. | |
| 7,495,294 B2 | 2/2009 | Higashitani | |
| 7,951,669 B2 | 5/2011 | Harari et al. | |
| 7,985,682 B2 | 7/2011 | Matsuzaki | |
| 8,158,333 B2 | 4/2012 | Hashimoto | |
| 8,194,470 B2 | 6/2012 | Higashitani | |
| 8,227,354 B2 | 7/2012 | Kim et al. | |
| 8,557,704 B2 | 10/2013 | Wells et al. | |
| 9,209,038 B2 * | 12/2015 | Cantone | H01L 21/3086 |
| 2006/0216938 A1 | 9/2006 | Miyagawa et al. | |
| 2006/0234166 A1 | 10/2006 | Lee et al. | |
| 2007/0026684 A1 | 2/2007 | Parascandola et al. | |
| 2008/0131793 A1 | 6/2008 | Lee et al. | |
| 2010/0120247 A1 | 5/2010 | Park | |
| 2010/0155813 A1 | 6/2010 | Murata et al. | |
| 2010/0173492 A1 | 7/2010 | Kim et al. | |
| 2011/0104899 A1 | 5/2011 | Lam et al. | |
| 2012/0085733 A1 | 4/2012 | Mebarki et al. | |

(Continued)

OTHER PUBLICATIONS

Chen et al., "Self-Aligned Triple Patterning to Extend Optical Lithography for 1x Patterning," International Symposium on Lithography Extensions, Oct. 21, 2010, 20 pages.

(Continued)

*Primary Examiner* — Mamadou Diallo
(74) *Attorney, Agent, or Firm* — Davis Wright Tremaine LLP

(57) ABSTRACT

A method of forming narrow and wide lines includes forming mandrels separated by wider gaps and narrower gaps, forming sidewall spacers on sides of the gaps, and then removing the mandrels. Subsequent anisotropic etching extends through an underlying mask layer at locations between sidewall spacers that were formed in wider gaps, to thereby separate narrow line portions of the mask layer, without extending through the mask layer at locations between sidewall spacers that were formed in narrower gaps, thereby leaving wide line portions of the mask layer under the second sidewall spacers.

19 Claims, 9 Drawing Sheets

(56) References Cited

U.S. PATENT DOCUMENTS

| | | |
|---|---|---|
| 2012/0168841 A1 | 7/2012 | Chen et al. |
| 2012/0208361 A1 | 8/2012 | Ha |
| 2013/0065397 A1 | 3/2013 | Chen |
| 2014/0080299 A1 | 3/2014 | Sel et al. |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

\* cited by examiner

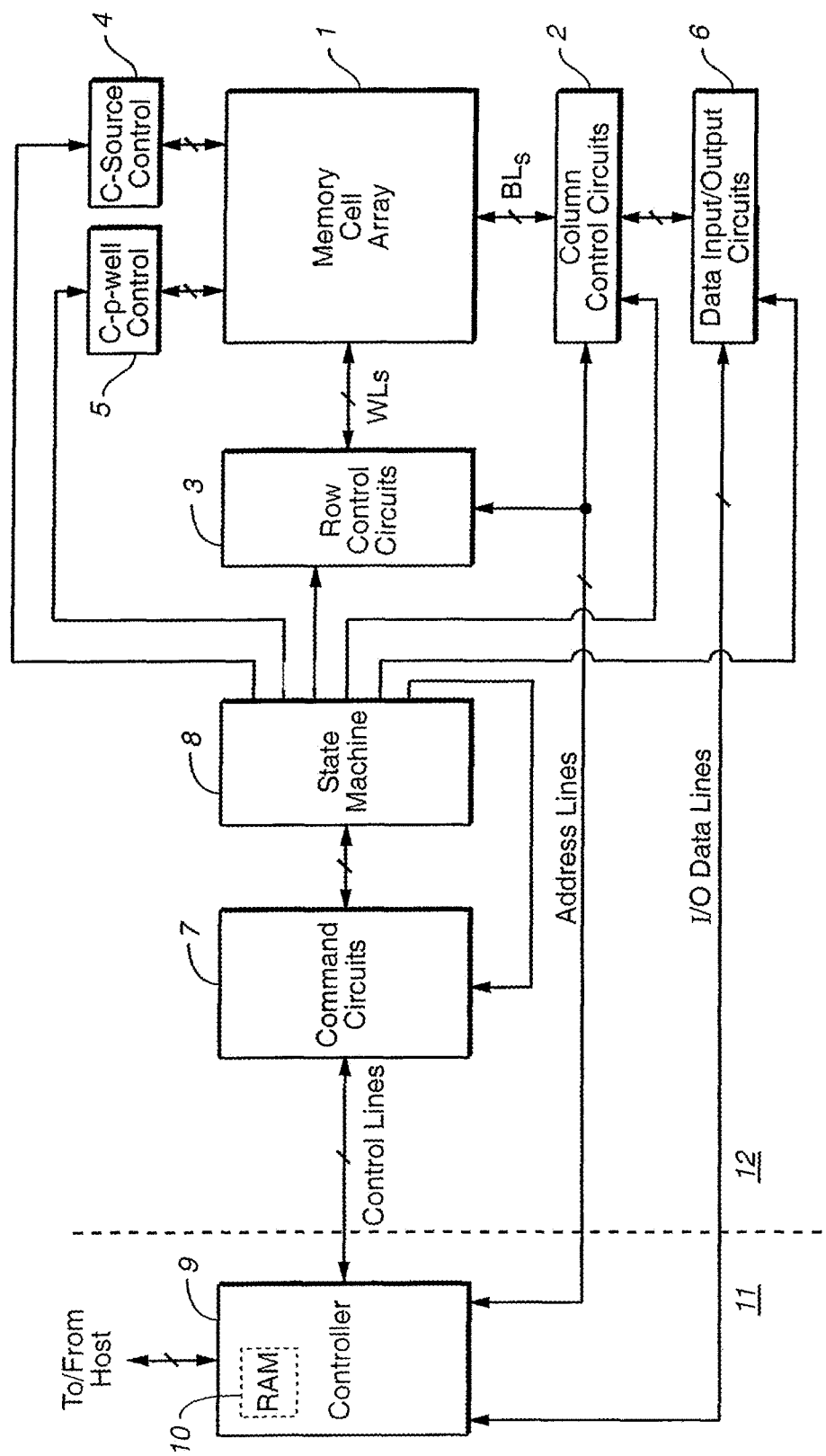
FIG._1 (Prior Art)

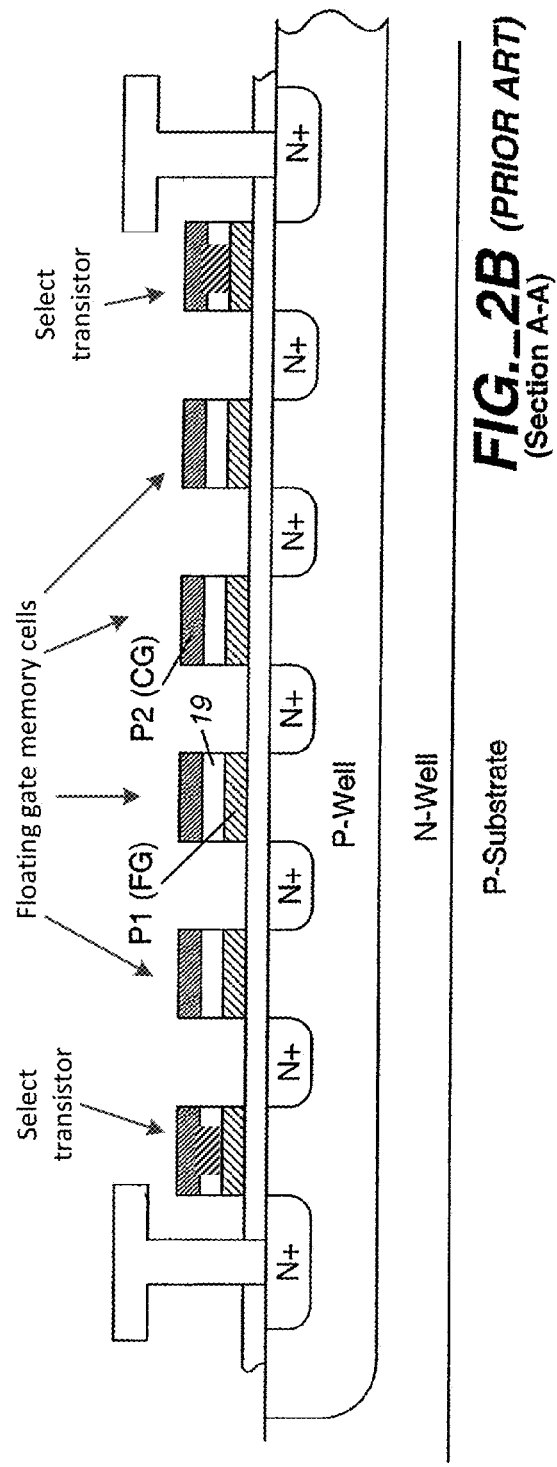
FIG._2B *(PRIOR ART)*
(Section A-A)

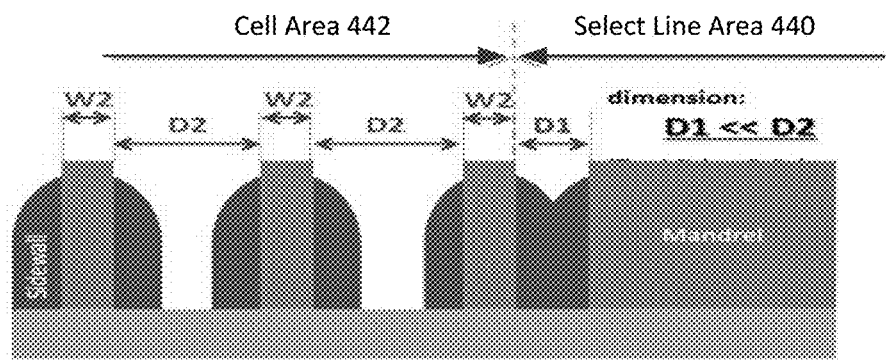
FIG. 14
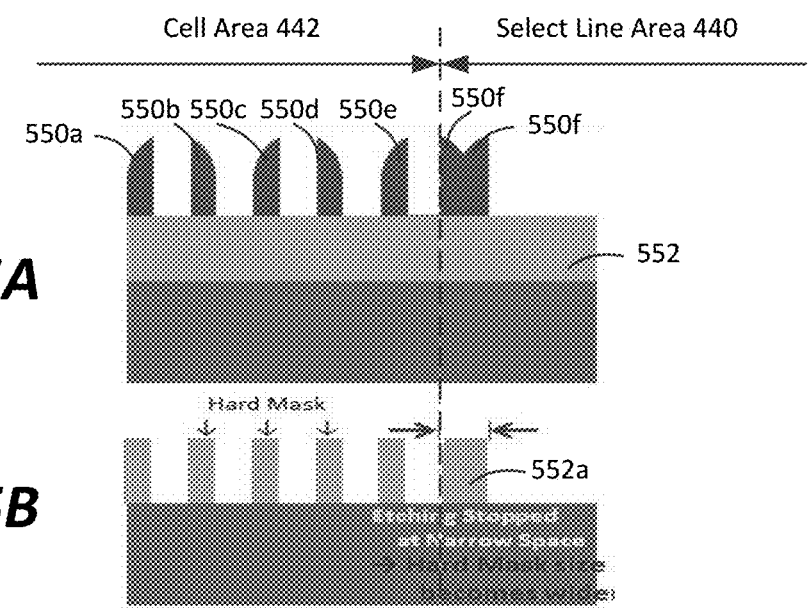
FIG. 15A
FIG. 15B

SIDEWALL ASSISTED PROCESS FOR WIDE AND NARROW LINE FORMATION

BACKGROUND

This application relates generally to integrated circuits (ICs) including non-volatile semiconductor memories of the flash memory type, their formation, structure and use, and to methods of making lines and other features in such ICs.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

Select transistors and peripheral circuits are formed on the same chip as the memory cells but they have very different functions that require different device structures. Thus, a process that is adapted for forming memory cells of a memory array may not be ideal for forming other structures such as select lines and peripheral structures. In general, the cost of manufacturing a memory chip increases with the number of processing steps used, and the number of defective units may tend to increase also. So it is desirable to use the same process steps for both the memory cells and other devices (e.g. select transistors and peripheral circuits).

Thus, there is a need for a memory chip manufacturing process that forms small structures such as memory cells and word lines, and other larger structures such as select transistors and select lines in an efficient manner.

SUMMARY

According to an example of a patterning process for forming narrow lines (e.g. word lines) and wide lines (e.g. select lines) using sidewall spacers formed along sides of a pattern of mandrels, mandrel spacing is relatively wide where narrow lines are to be formed and spacing is relatively narrow where wide lines are to be formed. Narrow mandrel spacing results in sidewall spacers that are close together, or touching. When such a pattern is transferred to an underlying hard mask layer by anisotropic etching, the close or touching sidewall spacers define wide strips of hard mask material because small gaps produce low etch rates (and contacting sidewalls block etching) so that the hard mask layer is not etched in these areas. Alignment of a resist pattern to such wide portions has a large margin (i.e. a high tolerance for misalignment). Wider spaced sidewalls on wider spaced mandrels allow etching completely through the underlying hard mask layer to thereby separate narrow portions of hard mask material. Narrower mandrels may also be used to form sidewall spacers close together so that etching through a hard mask layer does not occur at locations where narrow mandrels are removed. Thus, a sidewall spacer pattern may define narrow lines in one area while defining wider lines in another area by modifying mandrel spacing and/or mandrel width.

An example of a method of forming narrow and wide lines includes: forming a mask layer; subsequently forming a plurality of mandrels on an upper surface of the mask layer, the plurality of mandrels including first mandrels separated by first gaps and second mandrels separated by second gaps, the first gaps being wider than the second gaps; subsequently forming first sidewall spacers on sides of the first gaps and forming second sidewall spacers on sides of the second gaps; subsequently removing the plurality of mandrels; subsequently performing anisotropic etching, the anisotropic etching extending through the mask layer at locations between the first sidewall spacers, to thereby separate narrow line portions of the mask layer under the first sidewall spacers, without extending through the mask layer at locations between the second sidewall spacers thereby leaving wide line portions of the mask layer under the second sidewall spacers; and subsequently, patterning an underlying layer using the narrow line portions and the wide line portions.

A wide line pattern may subsequently be aligned with the wide line portions prior to the patterning, a perimeter of a patterned portion of the underlying layer defined by wide line portions. The patterned portion of the underlying layer may subsequently define a select line of a NAND flash memory. The narrow line portions may define word lines of the NAND flash memory. An individual first mandrel may have a first width and an individual second mandrel may have a second width that is less than the first width. The second width may be approximately equal to a gap between second sidewall spacers. The anisotropic etching may extend through the mask layer where the first mandrels were removed and may extend only partially through the mask layer where the second mandrels were removed. The method may also include forming word lines of a NAND flash memory extending in a first direction, the word lines defined by the narrow line portions, and forming connecting lines extending in a second direction that is perpendicular to the first direction, the connecting lines defined by the wide line portions, the connecting lines having a lower electrical resistance per unit length than the word lines. The method may also include forming contact pads, the connecting lines extending from the word lines to the contact pads. Opposing second sidewall spacers that are formed on opposing sides of an individual second gap may lie in direct contact and prevent any etching of the mask layer at a location between the opposing second sidewall spacers. Opposing second sidewall spacers that are formed on opposing sides of an individual second gap are separated by a narrow gap to reduce etching of the mask layer at a location between the opposing second sidewall spacers so that the anisotropic etching extends less than 50% through the mask layer at the location.

An example of a method of forming word lines and select lines includes: forming a mask layer; subsequently forming mandrels on an upper surface of the mask layer, the mandrels including wide mandrels in a first region and narrow mandrels in a second region; subsequently forming a plurality of sidewall spacers on sides of the mandrels, the sidewall spacers separated by first gaps in the first region and separated by second gaps in the second region, the second gaps being narrower than the first gaps; subsequently removing the mandrels; subsequently performing anisotropic etching, the anisotropic etching extending through the mask layer to separate narrow mask portions under individual sidewall spacers in the first region while leaving wide mask portions extending between a plurality of sidewall spacers in the second region; subsequently aligning a select line pattern with the wide mask portions to define the second regions where select lines are to be formed; and subsequently, patterning an underlying stack of layers using the narrow mask portions to define word lines in the first region and using the select line pattern with the wide mask portions to define select lines in the second region.

Forming the mandrels on the upper surface of the mask layer may include photolithographic patterning to form directly patterned portions and subsequent slimming of the directly patterned portions to reduce one or more dimension of the directly patterned portions. Forming the plurality of sidewall spacers may include depositing a blanket layer and subsequently performing anisotropic etching of the blanket layer to leave sidewall spacers. The anisotropic etching may have a first etch rate on first areas of the mask layer exposed by the first gaps and may have a second etch rate that is slower than the first etch rate on second areas of the mask layer exposed by the second gaps, the anisotropic etching stopping after the mask layer is etched through in the first areas and before the mask layer is etched through in the second areas. An additional wide mask portion may be formed in a third region, the narrow mask portions and the wide mask portions extending in a first direction and the additional wide mask portion extending in a second direction that is perpendicular to the first direction. Word lines of a NAND flash memory may be formed by patterning from the narrow mask portions, select lines formed by patterning from the wide mask portions, and connections between word lines and contact pads formed using the additional wide mask portions.

An example of a method of forming word lines and select lines of a NAND flash memory includes: forming a mask layer; subsequently forming mandrels on an upper surface of the mask layer; subsequently forming a plurality of sidewall spacers on sides of the mandrels, the sidewall spacers separated by first gaps in a first region and separated by second gaps in a second region and a third region, the second gaps being narrower than the first gaps; subsequently removing the mandrels; subsequently performing anisotropic etching, the anisotropic etching extending through the mask layer to separate narrow mask portions under individual sidewall spacers in the first region while leaving select line mask portions extending between a plurality of sidewall spacers in the second region and connecting line mask portions extending between a plurality of sidewall spacers in the third region; aligning a select line pattern with the select line mask portions to define the second regions where select lines are to be formed; aligning a contact pad pattern with the connecting line mask portions; and subsequently, patterning an underlying stack of layers using the narrow mask portions to define word lines in the first region, using the select line pattern with the wide mask portions to define select lines in the second region, and using the contact pad pattern with the connecting line mask portions to define contact pads and connecting lines between word lines and contact pads in the third region.

The mandrels may include wide mandrels and narrow mandrels, and after removing the mandrels, the anisotropic etching may extend gaps left by removal of wide mandrels through the mask layer and may extend gaps left by removal of narrow mandrels only partially through the mask layer. The gaps left by removal of the wide mandrels in the first region may have a width approximately equal to a width of the first gaps.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.

FIG. 2B is a cross section of a NAND string of FIG. 2A.

FIG. 14 shows another example of a mandrels and sidewall spacers for forming wide and narrow lines.

FIGS. 15A-B illustrate how the pattern of FIG. 14 is used to form narrow and wide lines.

DETAILED DESCRIPTION OF EXEMPLARY EMBODIMENTS

Memory System

Figure 2A:
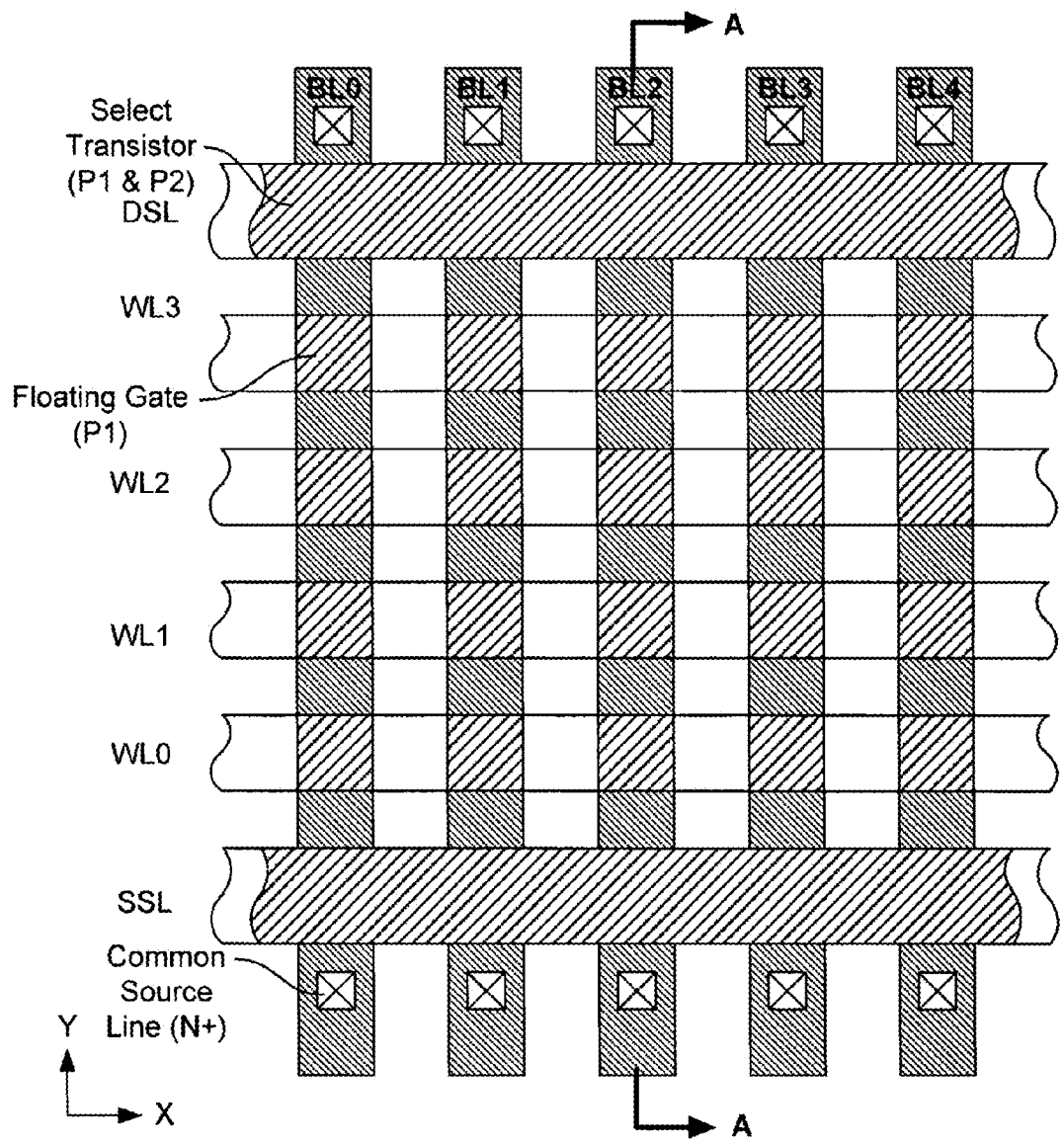
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2B show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series with select transistors at each end of the NAND string.

In some cases, it is desirable to form certain structures such as select lines and select transistors with larger dimensions than word lines and memory cell transistors. For example, larger select transistors may provide better isolation of unselected NAND strings than smaller transistors would. Transistors and lines in peripheral areas may also be larger than word lines and memory cells. Forming such lines and transistors with larger dimensions presents some problems particularly when forming word lines and memory cells with very small dimensions. It will be understood that word lines and underlying memory cell transistors are generally formed in a common series of process steps in which a stack of layers is etched to form word lines that are self-aligned with memory cells. Similarly, select lines are generally self-aligned with select transistors and may be formed in the same etch step that forms word lines and memory cells, using a common pattern that has narrow pattern elements for word lines and wide pattern elements for select lines.

In some cases, word lines and memory transistors are formed using sidewall spacers that allow minimum dimensions that are smaller than would be achievable using direct patterning by photolithography. However, sidewall spacers are generally formed having a uniform width (which may be equal to word line width) and forming wider conductive lines (such as select lines) may require additional patterning.

Figure 3:
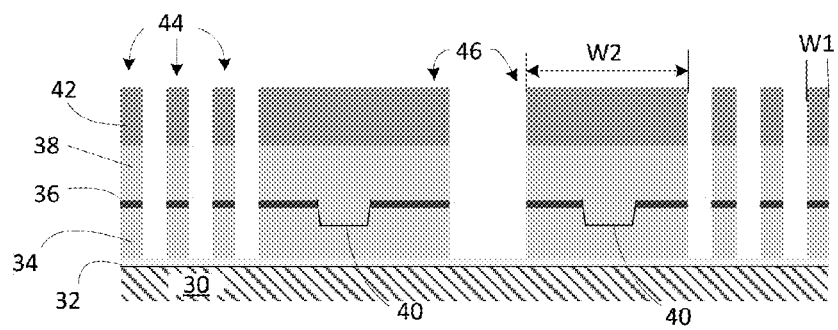
FIG. 3 illustrates an example of a cross section of a NAND string with wide select lines.

FIG. 3 shows a cross section of a portion of a NAND flash memory array at an intermediate stage of fabrication showing the layers of materials (after patterning to form separate memory cells and select transistors) according to an example. A gate dielectric (tunnel dielectric) layer 32 extends along the surface of substrate 30. The gate dielectric layer 32 may be formed of Silicon Dioxide ("oxide") or other suitable dielectric material. A first layer of conductive material 34 overlies gate dielectric layer 32 and is patterned into separate floating gates of memory cells. The first conductive layer 34 may be formed from doped polysilicon and may be referred to as "floating gate polysilicon." A dielectric layer 36 overlies first conductive layer 34. A second conductive layer 38 overlies the dielectric layer 36. The second conductive layer may be formed of doped polysilicon and may be deposited in two deposition steps. The dielectric layer may be referred to as "Inter Poly Dielectric" (IPD) because it is located between polysilicon layers 34 and 38. Openings 40 in dielectric layer 36 allow contact between the first and second polysilicon layers in certain locations. A layer of metal 42 overlies the second polysilicon layer 38. A suitable metal may be Tungsten, with a suitable barrier layer (e.g. Tungsten Nitride or similar layer).

The cross-section of FIG. 3 shows the structure after patterning (e.g. after forming a layer of resist, performing photolithographic patterning of the resist, and performing anisotropic etching such as RIE) to form separate memory cells 44 which each include a floating gate and a control gate. An individual control gate is formed of a portion of second conductive layer 38 and metal layer 42 where they overlie a floating gate formed by a portion of conductive layer 34. The control gate is electrically isolated from the floating gate by a portion of dielectric layer 36 which thus permits some capacitive coupling while preventing current flow between these elements.

In contrast to floating gate memory cells 44, select transistors 46 do not include floating gates. Openings 40 provide electrical contact between floating gate polysilicon layer 34 and control gate polysilicon layer 38 so that a single electrically continuous body is formed that acts as an active gate of the select transistor. Also, the dimensions of select transistors 46 are different to those of memory cell transistors 44. While memory cell transistors 44 have a width W1 (dimension along the bit line direction), select transistors 46 have a greater width W2 in this example. Such larger transistors may allow better control of current through NAND strings, for example, by providing better isolation than a smaller transistor.

Forming both wide and narrow structures, such as select transistors and memory cells, using the same process steps may present certain problems. For example, where sidewall spacers are used to pattern narrow features such as memory cells and word lines, it may be difficult to form larger features using the same process steps. Sidewall spacers are generally formed having a uniform width so that some subsequent processing may be needed to form wider structures that have a width that is greater than the width of a single sidewall spacer.

Figure 4:
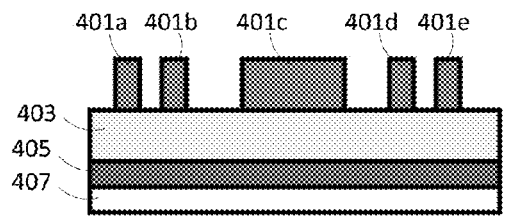
FIG. 4 shows a cross section of a NAND device at an intermediate stage of fabrication.

FIGS. 4-11 illustrate an example of a process in which sidewall spacers are used to form a pattern of word lines and to establish locations of edges of select lines. FIG. 4 shows patterned portions of photoresist 401a-e that are formed by conventional photolithographic patterning. The photoresist overlies a sacrificial layer 403, which overlies a hard mask layer 405. These layers may in turn overlie a stack of layers 407 to be patterned (e.g. floating gate poly, IPD, control gate poly, control gate metal, etc.). It will be understood that the underlying layers to be patterned may vary depending on the nature of the integrated circuit being formed.

FIG. 4 shows the structure at an intermediate stage of fabrication with portions of photoresist 401a-e. A wide portion of photoresist 401c is present in a central area of the structure shown where select lines are to be formed, and narrower portions of photoresist 401a,b,d,e are present on either side in areas where word lines are to be formed. The portions of photoresist may be patterned by conventional photolithography. Smaller portions may be formed having the a width that is equal to the minimum feature size achievable with the photolithographic process used (F) and may be spaced apart by a spacing that is equal to the smallest feature size (F).

Figure 5:
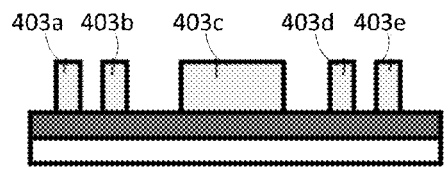
FIG. 5 shows the device of FIG. 4 after formation of mandrels.

FIG. 5 shows the structure after the portions of photoresist 401a-e of FIG. 4 are used to pattern underlying sacrificial layer 403 (e.g. silicon oxide). The photoresist portions act as an etch mask so that the pattern is transferred to sacrificial layer 403. This forms mandrels 403a-e of the sacrificial material, including a wide mandrel 403c in the central area and narrow mandrels 401a,b,d,e on either side.

Figure 6:
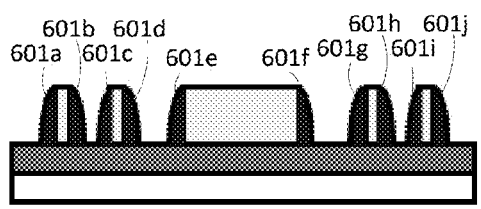
FIG. 6 shows the device of FIG. 5 after formation of sidewall spacers.

FIG. 6 shows the structure of FIG. 5 after slimming of mandrels 403a-e (e.g. by isotropic etching) to reduce the widths of mandrels and formation of sidewall spacers 611a-j. Slimming may reduce the width of narrow mandrels to less than F (e.g. F/2). Spaces between neighboring mandrels are widened accordingly to be greater than F (e.g. 3F/2). Sidewall spacers 601a-j are then formed along sides of slimmed mandrels, e.g. by depositing a blanket layer of sidewall spacer material and etching back to leave sidewall spacers.

Figure 7:
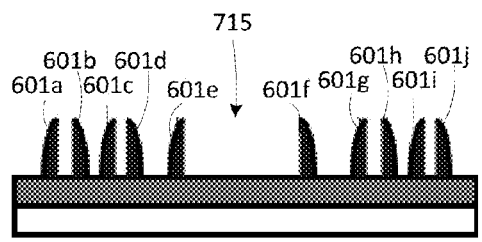
FIG. 7 shows the device of FIG. 6 after removal of mandrels.

FIG. 7 shows the structure of FIG. 6 after removal of mandrels to leave sidewall spacers 601a-j. Sidewall spacers 601a-j have a width of approximately F/2 in this example. A pair of sidewall spacers 601e and 601f are separated by a wide gap 715 in the central area where select lines are to be formed. Sidewall spacers 601a-d, and 601g-j on either side are separated by smaller gaps (approximately F/2 in this example).

Figure 8:
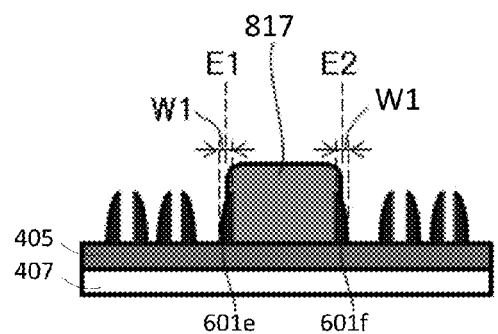
FIG. 8 shows alignment of a second pattern with the sidewall spacers.

FIG. 8 shows subsequent processing to form a photoresist portion 817 in the central area. Another photolithographic process is used to form photoresist portion 817. It can be seen there is little margin for aligning photoresist portion 817. The sidewall spacers have a width W1 (e.g. F/2) and the edges of photoresist portion 817 should be located over sidewall spacers so that the sidewall spacers define the edges of select lines. Thus, edges E1 and E2 of the portion of photoresist should be located within W1/2 (e.g. approximately F/4), of their ideal location over the middle of sidewall spacers S1 and S2.

Figure 9:
FIG. 9 shows the patterning of a hard mask layer according to the pattern of FIG. 8.

FIG. 9 shows the results of subsequent transfer of the pattern of FIG. 8 to underlying hard mask layer 405. Sidewall spacers establish locations of narrow lines in the side areas where word lines are to be formed. Sidewall spacers 601e, 601f and resist portion 817 establish locations of select lines in the central location.

Figure 10:
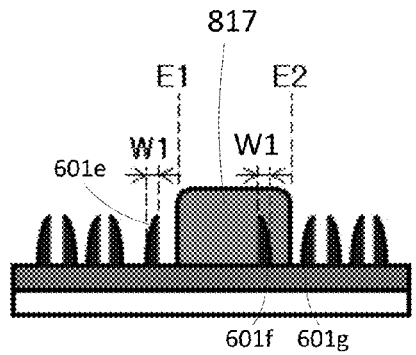
FIG. 10 shows an example of misalignment.
Figure 11:
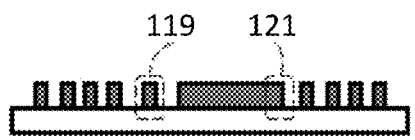
FIG. 11 shows a result of misalignment of FIG. 10.

Misalignment of photoresist portion 817 can have serious consequences. FIG. 10 shows an example where photoresist portion 817 is shifted to the right so that edge E1 is located within the wide gap and edge E2 is located between sidewalls 601f and 601g. As a result, sidewall 601e defines an additional unwanted narrow line 119 (FIG. 11) instead of defining the edge of a wide line. Edge E2 may be too close to the nearest narrow line so that a select line is formed too close to a word line, which may affect electrical characteristics, e.g. causing unacceptable coupling. In some cases photoresist may contact sidewall spacer 601g causing a select line and word line to be connected and thus electrically shorted together as shown in FIG. 11 at location 121.

As device dimensions become smaller alignment of patterns becomes harder. For example, aligning a pattern such as photoresist portion with a pattern of sidewall spacers, each approximately F/2 wide, provides a margin of about F/4 which becomes very hard to achieve as F becomes smaller. Even if such alignment is achievable, it may be costly because of the sophisticated equipment needed for such precision and yield may be low.

Figure 12:
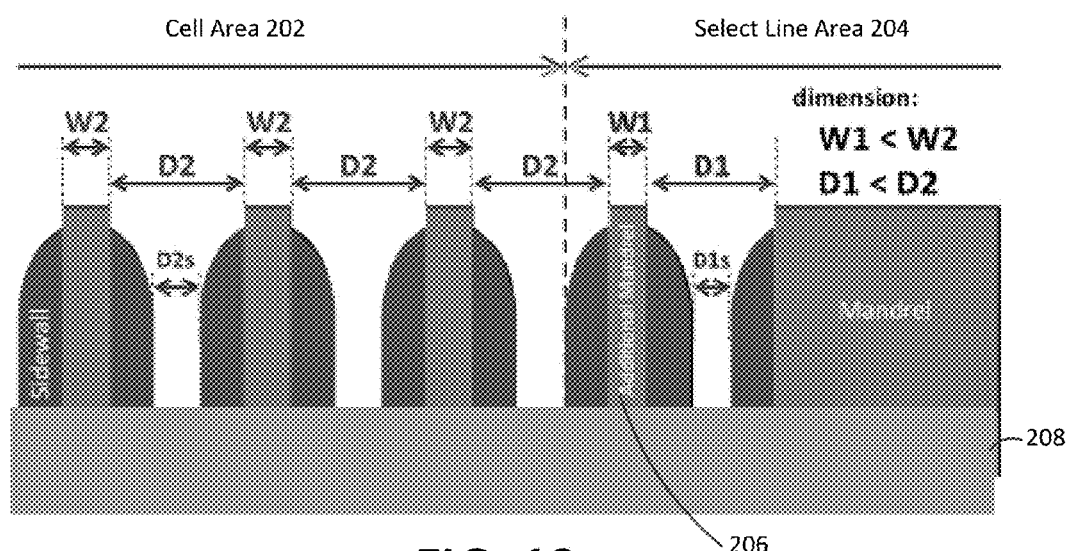
FIG. 12 shows an example of mandrels and sidewall spacers for forming wide and narrow lines.

FIG. 12 shows an example of a sidewall spacer pattern that facilitates formation of both narrow and wide lines in a common patterning process. Two regions are shown in FIG. 12 a cell array area 202 where narrow word lines are to be formed on the left and a select line area 204 where wider select lines are to be formed on the right.

In the cell area 202, mandrels are formed a distance D2 apart, with each mandrel having a width of W2. When sidewall spacers are formed along sides of mandrels, this results in a gap between sidewall spacers in the cell array area of D2s. In contrast, in the select line area 204, mandrels are formed a distance D1 apart, where D1 is less than D2, and mandrel 206 has a width of W1, which is less than W2 (additional narrow mandrels may be provided in other examples). Thus, the spacing of sidewall spacers is different in these two areas.

In the cell array area 202, sidewall spacers are relatively widely spaced. Spacing between neighboring sidewall spacers along neighboring mandrels is D2s and spacing between neighboring sidewall spacers that share a mandrel is W2 in this example. D2s and W2 may be approximately equal. In general, the spacing in the cell array area is determined by the size and spacing of features to be formed in this area. In the example of a NAND flash memory array, the word lines (and underlying floating gates) are patterned by these sidewall spacers so that the dimensions D2s and W2 may be the desired spacing between word lines. In contrast, the smaller spacing in the select line area 204 is not intended to pattern individual features. Instead the smaller spacing generally results in a lower etching rate when the sidewall spacer pattern is transferred to an underlying layer. The microloading effect generally results in a lower etch rate in small openings compared with bigger openings. Thus, when mandrels are removed and the pattern is transferred by anisotropic etching, the etch rate through relatively small openings W1 and D1s in the select line area 204 is lower than the etch rate through the larger openings W2 and D2s in the cell array area 202. (W1 and D1s may be approximately the same size.) This difference in etch rate can allow complete etching in cell area 202 (etching completely through the underlying layer 208) while etching through narrower openings in the select gate area 204 may be only partial (etching does not go through the underlying layer 208).

FIGS. 13A-E illustrate an example of how the different spacing of FIG. 12 may facilitate formation of narrow lines (word lines) and wide tines (select lines) in a common process.

Figure 13A:
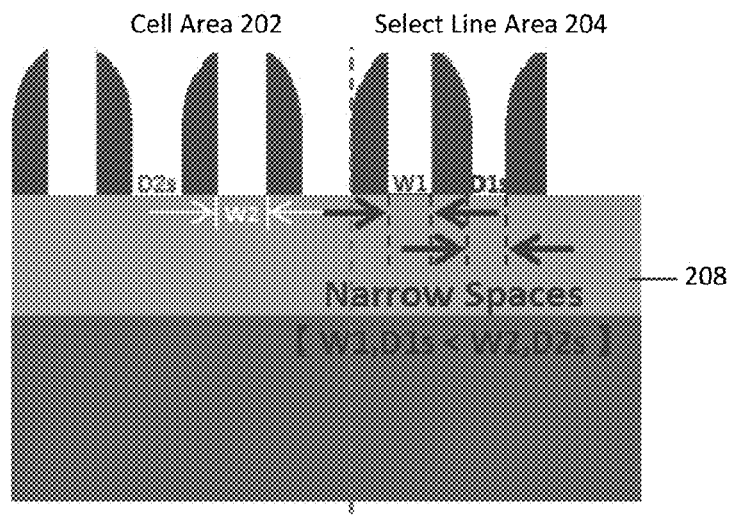
FIGS. 13A-D illustrate how word lines and select lines may be formed from the pattern of FIG. 12.

FIG. 13A shows the structure of FIG. 12 after mandrels are removed. Spacing in the cell array area 202 and the select line area 204 are different (narrower spacing in the select line area 204 than in the cell array area 202, i.e. W1 and D1s<W2 and D2s).

Figure 13B:
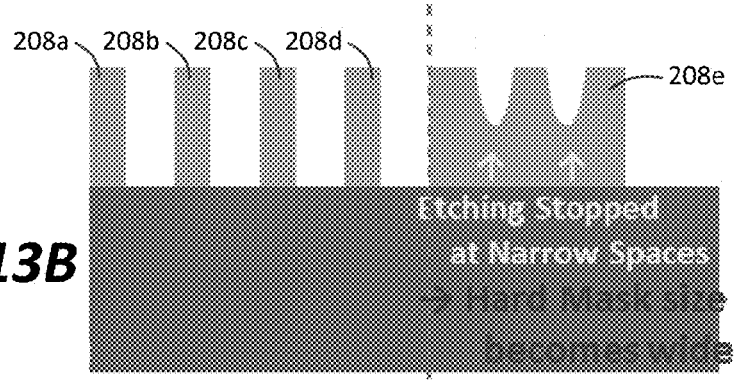

FIG. 13B shows the result of anisotropic etching to transfer the sidewall spacer pattern to an underlying hard mask layer 208. While etching extends completely through the hard mask layer 208 in the memory cell area, leaving lines 208a-d separated by gaps, etching extends only partially through the hard mask layer 208 in the select gate area 204 because of the lower etching rate through the smaller openings in this area. Thus, a relatively wide undivided portion 208e of the hard mask layer remains in this area. Exposed areas of this portion may be partially etched (e.g. less than half way through) but etching stops before the portion is etched through.

Figure 13C:
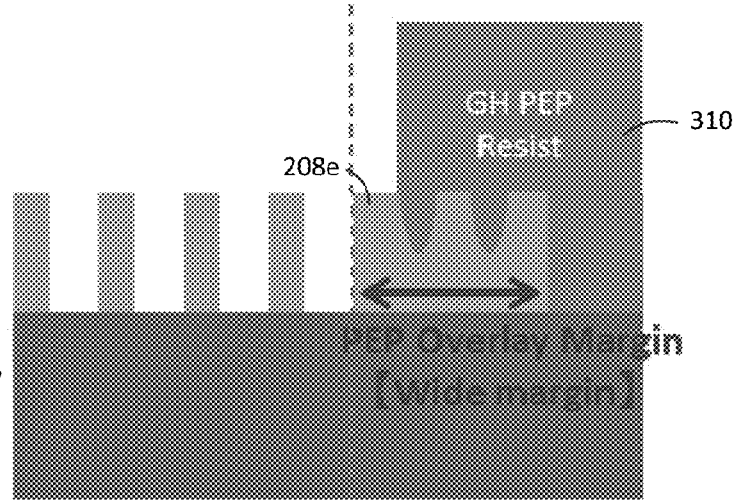

FIG. 13C shows subsequent formation of a photoresist portion 310 that overlies the select gate area 204 during subsequent etching. In contrast to the previous example in which edges of such photoresist portions required very precise alignment (see FIGS. 8-11), in this example, a relatively wide portion 208e of hard mask layer remains to facilitate alignment by providing a wide margin. It can be seen that the edge of a select gate may be defined by the edge of the hard mask portion 208e in this example, not by the photoresist portion.

Figure 13D:
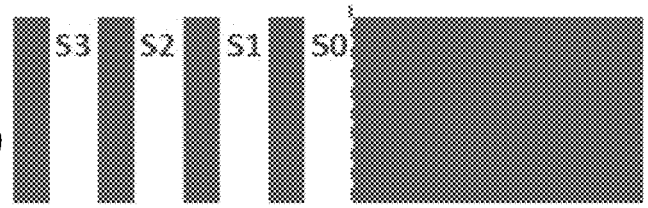

FIG. 13D shows the result of patterning an underlying structure (e.g. a stack of floating gate and control gate materials) using the pattern of FIG. 13C. Relatively narrow lines are formed in the cell array area 202 while a wide line is formed in the select gate area 204.

While the example of FIGS. 12-13 uses narrower mandrels and closer mandrel spacing in the select gate area, in other examples, only spacing between mandrels may be narrowed (not mandrel width). In some cases, the spacing may be narrowed so that the sidewall spacers between mandrels occupy the entire gap between mandrels (i.e. even after etching back to separate sidewall spacers in the memory array area, sidewall spacers remain together in the select gate area). Thus, the gap may be less than twice the width of sidewall spacers.

FIG. 14 shows an example in which spacing between mandrels in a select line area 440 is small enough so that sidewall spacers remain together (not separated) in this area. Specifically, the distance D1 in this example is approximately twice the width of a sidewall spacer. Mandrels all have a width W2 (except for the large mandrel in the select gate area). In cell area 442 mandrels have spacing D2, which is greater than D1 and leaves significant space between sidewall spacers.

FIGS. 15A-B illustrate how the mandrels and sidewall spacers of FIG. 14 may be used to form wide and narrow lines.

FIG. 15A shows the structure of FIG. 14 after removal of mandrels to leave sidewall spacers 550a-g. Sidewall spacers 550f-g form a relatively wide undivided portion in select line area 440.

FIG. 15B shows the results of anisotropic etching to transfer the pattern of FIG. 15A to the underlying hard mask layer 552. Narrow strips of hard mask material are formed in the memory cell area 442 while a relatively wide strip 552a of hard mask material is formed in the select gate area. This wider portion provides a relatively wide margin for alignment of a resist portion (approximately twice the width of a sidewall spacer, i.e. twice the margin of example of FIG. 8).

While select lines are one example of wide lines that may be formed in parallel with narrow lines (such as word lines) using a sidewall assisted process, other wide lines may also be formed in parallel and may be facilitated by techniques illustrated here.

Figure 16A:
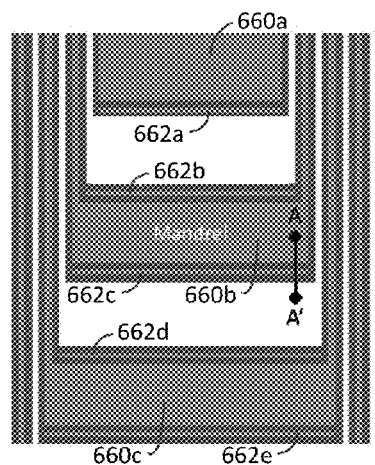
FIGS. 16A-B illustrate sidewalls and mandrels in a hookup area.
Figure 16B:
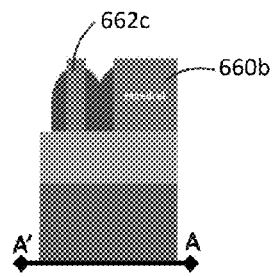

FIGS. 16A-B illustrate an example of a hookup area of a NAND flash memory. A hookup area is where word lines connect to contact areas to allow vertical metal contacts (vias) to connect the word lines as part of a larger array (e.g. connecting word lines of a block to global word lines). While word lines are generally very narrow, contact pads are larger to provide adequate area for connection. The geometry of connecting word lines and contact pads may affect overall word line resistance and narrower lines may have higher failure rates (e.g. collapse, or etch damage).

FIG. 16A shows a plan view of a hookup area that includes wide mandrels 660a-c and narrow mandrels 662a-e. In particular, narrow mandrels extend near edges of wide mandrels. FIG. 16B shows a cross section along A-A' that illustrates wide mandrel 660b and narrow mandrel 662c and sidewall spacers formed along sides of these mandrels. Sidewall spacers fill the narrow gap between wide mandrel 660b and narrow mandrel 662c and an additional sidewall spacer is formed along the side of the narrow mandrel 662c.

Figure 17A:
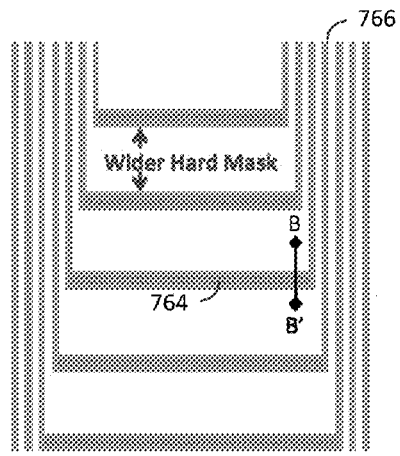
FIGS. 17A-B illustrate the area of FIGS. 16A-B after mandrel removal and pattern transfer.
Figure 17B:
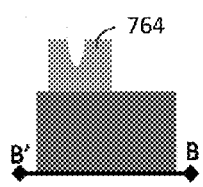

FIGS. 17A-B illustrate the result of anisotropic etching of the structure of FIG. 16A-B (after removal of mandrels). It can be seen that portions of hard mask material remain where sidewall spacers extended over the hard mask layer with wider portions of hard mask material formed where narrow mandrels were located. In particular, etching extends only partially through the hard mask layer at the location where the narrow mandrel 662c was located leaving a wide portion 764. In contrast, narrower strips of hard mask material, e.g. strip 766 (having a width equal to one sidewall spacer) extend where word lines are to be formed).

Figure 18:
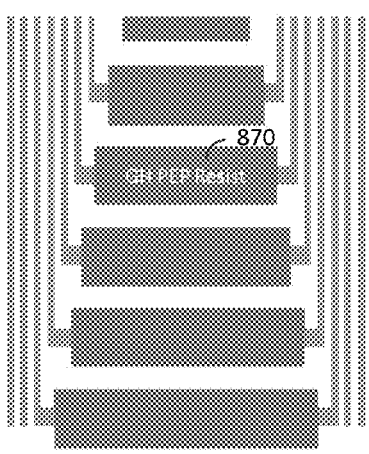
FIG. 18 illustrates the area of FIG. 17A after patterning of resist.

FIG. 18 shows resist portions (e.g. portion 870) that are added to define contact pads. These resist portions may overlie hard mask portions of FIGS. 17A-B so that the combination of resist and hard mask material define a pattern that is then transferred to one or more underlying layer.

Figure 19:
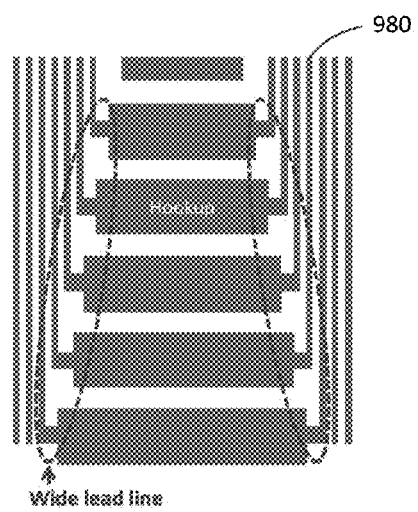
FIG. 19 illustrates the area of FIG. 18 after patterning of underlying layer(s).

FIG. 19 illustrates the results including relatively narrow word lines (e.g. word line 980 formed from strip 766) connected to contact pads by relatively wide connecting lines ("wide lead lines" in area indicated by dashed outline). Connecting lines extend in a direction that is perpendicular to the word lines. Such wide connecting lines provide relatively low electrical resistance and may improve reliability. In contrast with the select line examples above, in this example, wide hard mask portions are not used to facilitate alignment of another pattern. Instead the wide hard mask portions themselves, without additional resist or other patterning material, define conductive lines. Thus, sidewall assisted patterning as described here can be used to facilitate alignment to form large patterns, or can be used alone to form both narrow lines and wide lines using a common mandrel pattern.

Figure 20:
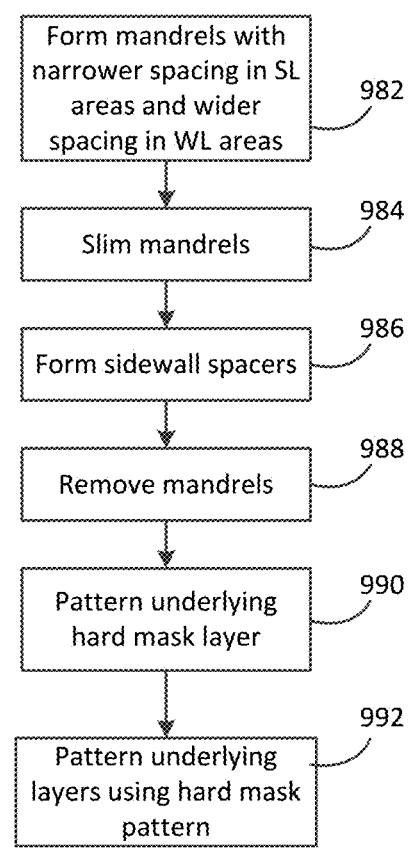
FIG. 20 shows an example of steps in formation of wide and narrow lines using sidewall spacers.

FIG. 20 illustrates steps in formation of a NAND flash memory. Mandrels are formed 982 with narrower spacing in a select line ("SL") area and wider spacing in a word line ("WL") area. Mandrels may be formed by photolithographic patterning of photoresist. Subsequently, mandrels are slimmed 984. Sidewall spacers are formed 986 along sides of mandrels. Mandrels are then removed 988 and an underlying hard mask layer is patterned 990 to form separate narrow portions corresponding to word lines in the word line area, and to form relatively wide undivided portions corresponding to select lines in the select line area. Underlying layers are then patterned using this hard mask pattern 992. Such patterning may form word lines, select lines, peripheral lines, and other wide and narrow features in an integrated circuit.

CONCLUSION

Although the various aspects have been described with respect to exemplary embodiments, it will be understood that protection within the full scope of the appended claims is appropriate.

It is claimed:

1. A method of forming narrow and wide lines comprising:
    forming a mask layer;
    subsequently forming a plurality of mandrels on an upper surface of the mask layer, the plurality of mandrels including first mandrels separated by first gaps and second mandrels separated by second gaps, the first gaps being wider than the second gaps, wherein an individual first mandrel has a first width and an individual second mandrel has a second width that is less than the first width;
    subsequently forming first sidewall spacers on sides of the first gaps and forming second sidewall spacers on sides of the second gaps;
    subsequently removing the plurality of mandrels;
    subsequently performing anisotropic etching, the anisotropic etching extending through the mask layer at locations between the first sidewall spacers, to thereby separate narrow line portions of the mask layer under the first sidewall spacers, without extending through the mask layer at locations between the second sidewall spacers thereby leaving wide line portions of the mask layer under the second sidewall spacers; and
    subsequently, patterning an underlying layer using the narrow line portions and the wide line portions.

2. The method of claim 1 further comprising: aligning a wide line pattern with the wide line portions prior to the patterning, a perimeter of a patterned portion of the underlying layer defined by wide line portions.

3. The method of claim 2 wherein the patterned portion of the underlying layer subsequently defines a select line of a NAND flash memory.

4. The method of claim 3 wherein the narrow line portions define word lines of the NAND flash memory.

5. The method of claim 1 wherein the second width is approximately equal to a gap between second sidewall spacers.

6. The method of claim 1 wherein, the anisotropic etching extends through the mask layer where the first mandrels were removed and extends only partially through the mask layer where the second mandrels were removed.

7. The method of claim 1 further comprising: forming word lines of a NAND flash memory extending in a first direction, the word lines defined by the narrow line portions, and forming connecting lines extending in a second direction that is perpendicular to the first direction, the connecting lines defined by the wide line portions, the connecting lines having a lower electrical resistance per unit length than the word lines.

8. The method of claim 7 further comprising: forming contact pads, the connecting lines extending from the word lines to the contact pads.

9. The method of claim 1 wherein opposing second sidewall spacers that are formed on opposing sides of an individual second gap lie in direct contact and prevent any etching of the mask layer at a location between the opposing second sidewall spacers.

10. The method of claim 1 wherein opposing second sidewall spacers that are formed on opposing sides of an individual second gap are separated by a narrow gap to reduce etching of the mask layer at a location between the opposing second sidewall spacers so that the anisotropic etching extends less than 50% through the mask layer at the location.

11. A method of forming word lines and select lines comprising:
    forming a mask layer;
    subsequently forming mandrels on an upper surface of the mask layer, the mandrels including wide mandrels in a first region and narrow mandrels in a second region;
    subsequently forming a plurality of sidewall spacers on sides of the mandrels, the sidewall spacers separated by first gaps in the first region and separated by second gaps in the second region, the second gaps being narrower than the first gaps;
    subsequently removing the mandrels;
    subsequently performing anisotropic etching, the anisotropic etching extending through the mask layer to separate narrow mask portions under individual sidewall spacers in the first region while leaving wide mask portions extending between a plurality of sidewall spacers in the second region;
    subsequently aligning a select line pattern with the wide mask portions to define the second regions where select lines are to be formed; and
    subsequently, patterning an underlying stack of layers using the narrow mask portions to define word lines in the first region and using the select line pattern with the wide mask portions to define select lines in the second region.

12. The method of claim 11 wherein forming the mandrels on the upper surface of the mask layer comprises photolithographic patterning to form directly patterned portions and subsequent slimming of the directly patterned portions to reduce one or more dimension of the directly patterned portions.

13. The method of claim 11 wherein forming the plurality of sidewall spacers comprises depositing a blanket layer and subsequently performing anisotropic etching of the blanket layer to leave sidewall spacers.

14. The method of claim 11 wherein the anisotropic etching has a first etch rate on first areas of the mask layer exposed by the first gaps and has a second etch rate that is slower than the first etch rate on second areas of the mask layer exposed by the second gaps, the anisotropic etching stopping after the mask layer is etched through in the first areas and before the mask layer is etched through in the second areas.

15. The method of claim 11 further comprising: forming an additional wide mask portion in a third region, the narrow mask portions and the wide mask portions extending in a first direction and the additional wide mask portion extending in a second direction that is perpendicular to the first direction.

16. The method of claim 15 further comprising: patterning to form word lines of a NAND flash memory from the narrow mask portions, form select lines from the wide mask portions, and to form connections between word lines and contact pads using the additional wide mask portion.

17. A method of forming word lines and select lines of a NAND flash memory comprising:
forming a mask layer;
subsequently forming mandrels on an upper surface of the mask layer;
subsequently forming a plurality of sidewall spacers on sides of the mandrels, the sidewall spacers separated by first gaps in a first region and separated by second gaps in a second region and a third region, the second gaps being narrower than the first gaps;
subsequently removing the mandrels;
subsequently performing anisotropic etching, the anisotropic etching extending through the mask layer to separate narrow mask portions under individual sidewall spacers in the first region while leaving select line mask portions extending between a plurality of sidewall spacers in the second region and connecting line mask portions extending between a plurality of sidewall spacers in the third region;
aligning a select line pattern with the select line mask portions to define the second regions where select lines are to be formed;
aligning a contact pad pattern with the connecting line mask portions; and
subsequently, patterning an underlying stack of layers using the narrow mask portions to define word lines in the first region, using the select line pattern with the wide mask portions to define select lines in the second region, and using the contact pad pattern with the connecting line mask portions to define contact pads and connecting lines between word lines and contact pads in the third region.

18. The method of claim 17 further wherein the mandrels include wide mandrels and narrow mandrels, and wherein after removing the mandrels, the anisotropic etching extends gaps left by removal of wide mandrels through the mask layer and extends gaps left by removal of narrow mandrels only partially through the mask layer.

19. The method of claim 18 wherein the gaps left by removal of the wide mandrels in the first region have a width approximately equal to a width of the first gaps.

* * * * *